US 6,583,427 B1

(12) United States Patent
Edmonds et al.

(10) Patent No.: US 6,583,427 B1
(45) Date of Patent: Jun. 24, 2003

(54) EXTENDED LIFE SOURCE ARC CHAMBER LINERS

(75) Inventors: Walter J. Edmonds, Allen, TX (US); Timothy B. Vaughn, Lubbock, TX (US)

(73) Assignee: Texas Instruments Incorporated, Dallas, TX (US)

( * ) Notice: Subject to any disclaimer, the term of this patent is extended or adjusted under 35 U.S.C. 154(b) by 183 days.

(21) Appl. No.: 09/652,440

(22) Filed: Aug. 31, 2000

(Under 37 CFR 1.47)

Related U.S. Application Data

(60) Provisional application No. 60/152,165, filed on Sep. 2, 1999.

(51) Int. Cl.[7] ................................................ H01J 27/00
(52) U.S. Cl. ............... 250/492.21; 250/426; 250/423 R
(58) Field of Search ............................. 250/492.21, 426, 250/427, 423 R

(56) References Cited

U.S. PATENT DOCUMENTS 5,554,852 A * 9/1996 Bright et al. ........... 250/492.21
6,300,636 B1 * 10/2001 Shih et al. .................. 250/426

* cited by examiner

*Primary Examiner*—Kiet T. Nguyen
(74) *Attorney, Agent, or Firm*—Jacqueline J. Garner; W. James Brady, III; Frederick J. Telecky, Jr.

(57) ABSTRACT

A liner (102) for an arc chamber (100) of an ion implanter. The arc chamber (100) comprises a liner (102) on the inner surface (104) of the arc chamber (100) that extends the life of the arc chamber (100). The liner (102) comprises a one piece portion (102*a*) that covers the bottom and long sidewalls of the arc chamber (100) and two end plates (102*b*) for covering the end walls of the arc chamber (100). When the liner (102) wears out it is replaced at a significantly reduced cost compared to replacing the entire arc chamber (100).

13 Claims, 3 Drawing Sheets

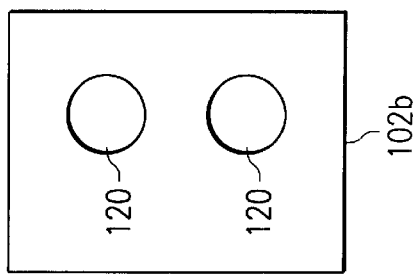
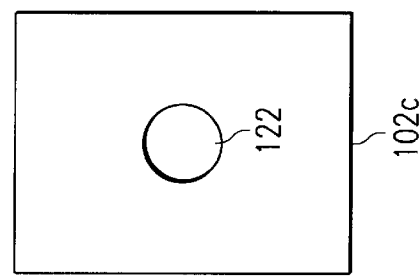
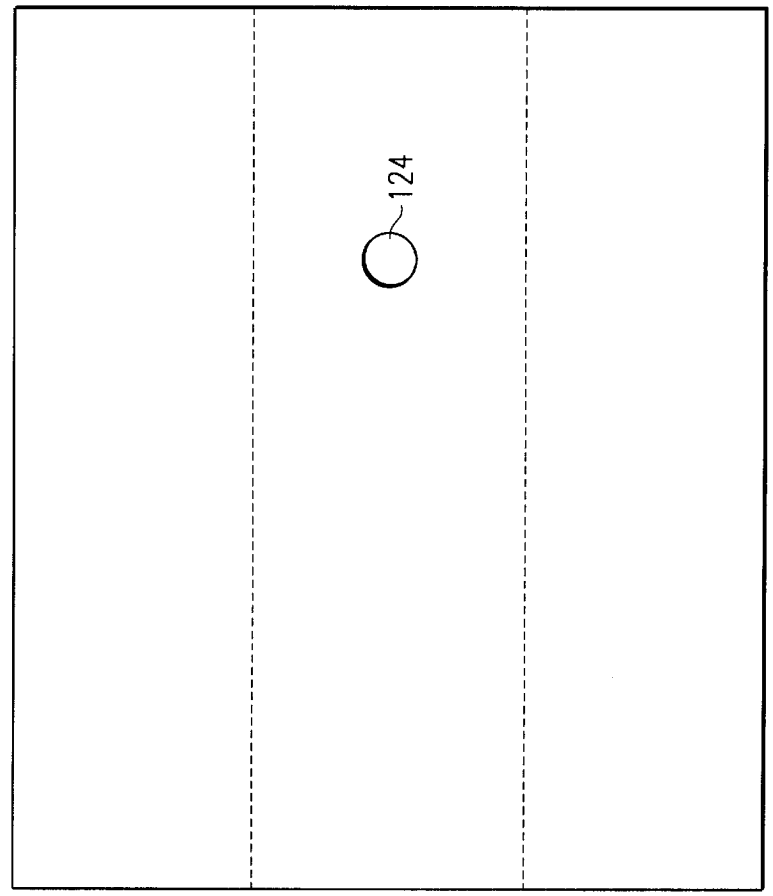

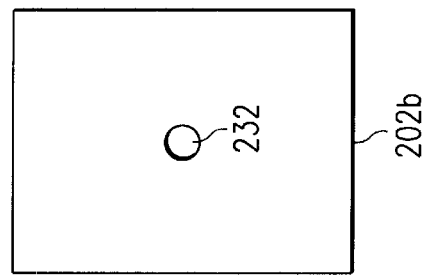
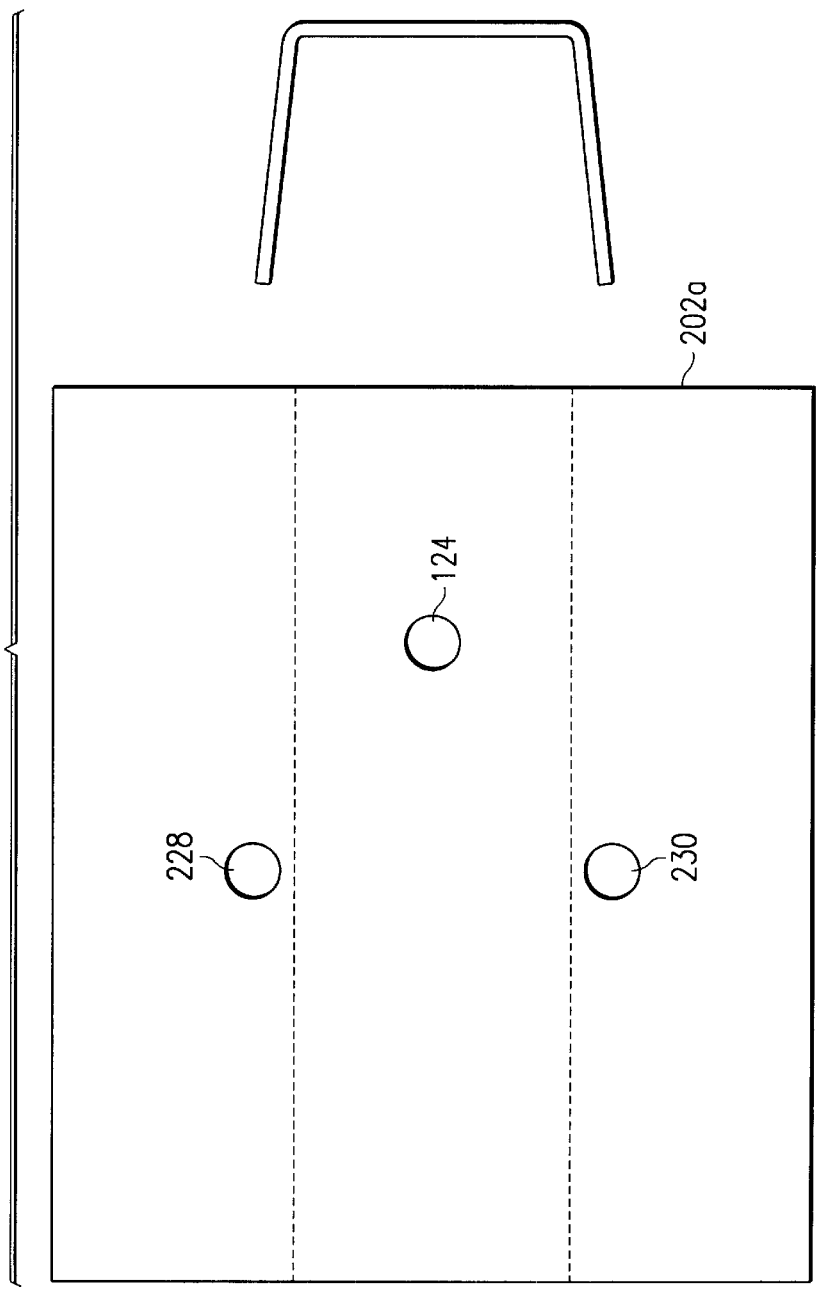

EXTENDED LIFE SOURCE ARC CHAMBER LINERS

This application claims priority under 35 USC § 119(e)(1) of provisional application No. 60/152,165 filed Sep. 2, 1999.

FIELD OF THE INVENTION

The invention is generally related to the field of ion implanters for semiconductor fabrication and more specifically to ARC chambers in ion implanters.

BACKGROUND OF THE INVENTION

In semiconductor processing, various regions of a semiconductor wafer are modified by implanting dopants, such as boron, phosphorus, arsenic, antimony and the like, into the body of the wafer to produce regions having varying conductivity (e.g., source and drain regions, channel adjusts, etc.). As the density of the semiconductor devices increases, stricter control of the areas to be implanted is required. Thus, ion implanters have been developed to accurately implant dopants into small areas.

In an ion implanter, an ion beam of the desired chemical species is generated by means of a current applied to a filament within an ion source chamber. One of the more common types of source is the Freeman source. In the Freeman source, the filament, or cathode, is a straight rod that can be made of tungsten or tungsten alloy, or other known source material such as iridium, that is passed into an arc chamber whose walls are the anode. The ions are extracted through an aperture in the arc chamber by means of a potential between the source chamber, which is positive, and extraction means. The size and intensity of the generated ion beam can be tailored by system design and operating conditions; for example, the current applied to the filament can be varied to regulate the intensity of the ion beam emitted from the ion source chamber.

A top view of a prior art arc chamber 10 is shown in FIG. 1. Arc Chamber 10 typically comprises molybdenum or tungsten and is fitted with an exit aperture 12 and with means 14 for feeding in the desired gaseous ion precursors for the desired ions. Arc chamber 10 includes a filament end 18 for inserting a filament and a repeller end 16. When power is fed to the filament, the filament temperature increases until it emits electrons that bombard the precursor gas molecules, breaking up the gas molecules so that a plasma is formed containing the electrons and various ions. The ions are emitted from the arc chamber 10 through the exit aperture 12 and selectively passed to the target.

The inner contour of arc chamber 10 is carefully designed and must be extremely accurate for proper operation. Unfortunately, the inner surface of the arc chamber 10 is damaged over time by the plasma. The surface of the arc chamber wears away. Sputtered deposits of tungsten or molybdenum from the chamber walls create an inefficiency in the extraction of positively charged ions from the source ACR chamber. After a time of 3–6 months, the arc chamber becomes unusable and must be replaced. Replacement ARC chambers cost on the order of $3000–$6000 and up. Thus, there is a desire to minimize this cost.

SUMMARY OF THE INVENTION

The invention is an arc chamber for an ion implanter. The arc chamber comprises a liner that extends the life of the arc chamber. When the liner wears out it is replaced at a significantly reduced cost compared to replacing the entire arc chamber.

An advantage of the invention is providing an arc chamber with an extended life versus the prior art.

This and other advantages will be apparent to those of ordinary skill in the art having reference to the specification in conjunction with the drawings.

BRIEF DESCRIPTION OF THE DRAWINGS

In the drawings:

FIG. 3 is a top view of a portion of the liner according to an embodiment of the invention;

FIG. 4 is a diagram of a first end plate portion of the liner according to an embodiment of the invention;

FIG. 5 is a diagram of a second end plate portion of the liner according to an embodiment of the invention;

FIG. 6 is a diagram of an end plate portion of the liner according to an alternative embodiment of the invention; and FIG. 7 is a diagram of a portion of the liner according to another alternative embodiment of the invention.

DETAILED DESCRIPTION OF THE EMBODIMENTS

Figure 1:
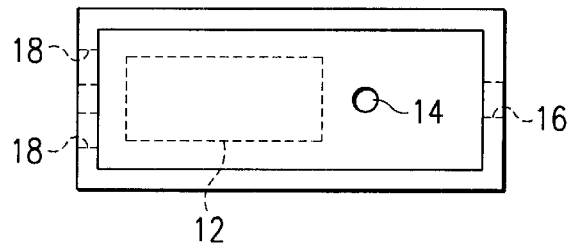
FIG. 1 is a top view diagram of a prior art arc chamber.
Figure 2A:
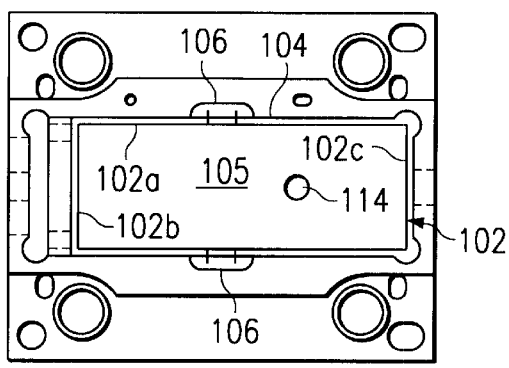
FIGS. 2A–2D are a top view and three side views, respectively, of an arc chamber having a liner according to the invention.
Figure 2B:
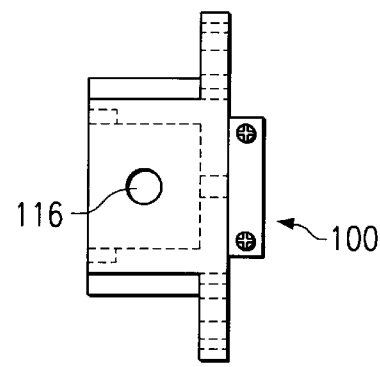
Figure 2D:
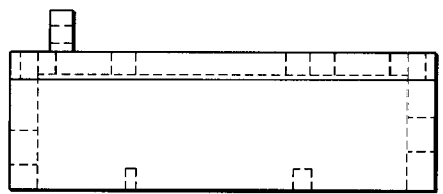
Figure 2C:
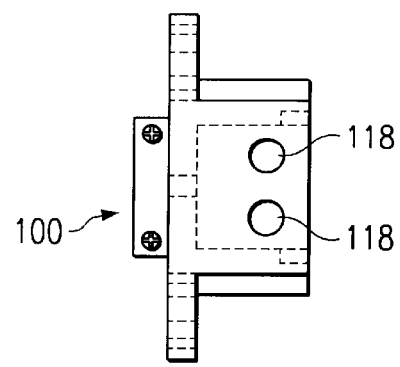

An arc chamber 100 according to the invention is shown in FIGS. 2A–2D. FIG. 2A is a top view, FIGS. 2B, 2C, and 2D are side views. Arc chamber 100 includes a removable liner 102 that covers the inner surface 104 of arc chamber 100.

Arc chamber 100 may be similar in construction to prior art arc chambers. Arc Chamber 100 may be fitted with an exit aperture (not shown) and with means 114 for feeding in the desired gaseous ion precursors for the desired ions. The arc chamber 100 also includes means 118 for inserting a filament and means 116 for a repeller. The repeller is a solid plate that repels the positive ion charge and plasma field.

Arc chamber 100 may comprise molybdenum or tungsten as in the prior art. Alternatively, arc chamber 100 may comprise addition materials, for example graphite, that are not currently used due to their interaction with the plasma. The liner 102 prevents the interaction of the arc chamber inner walls with the plasma, thus allowing the use of other materials. Some new products are even sensitive to molybdenum. The liner 102 of the invention allows the extended use of molybdenum in these new products. The material chosen for arc chamber 100, however, must still be able to withstand the high temperature requirements of an ion source.

Arc chamber 100 differs from prior art arc chambers in that the inner wall 104 is extended inward the width of liner 102. For example, a prior art arc chamber may be used. The inner wall of the prior art arc chamber is milled out a distance equal to the width of the liner. This may be on the order 0.06 of an inch ±0.04 inches. Then liner 102 is inserted. Alternatively, arc chamber 100 may be fabricated with an inner space extended by the thickness of the liner.

Liner 102 consists of a one-piece three-sided portion 102a (shown in FIG. 3) and two end plates 102b and 102c, as shown in FIGS. 4 and 5. The two end plates 102b and 102c are inserted at the ends of arc chamber 100. End plate 102b is inserted at the filament end of the arc chamber and includes apertures 120 for the insertion of a filament. End plate 102c is inserted at the repeller end and includes an aperture 122 for the insertion of a repeller. Apertures 120 and 122 are designed to match those in arc chamber 100 and the filament and repellant to be used. If different filament or repeller configurations are to be used, then the apertures should be adjusted accordingly. For example, FIG. 6 shows an alternative end plate 202b that may be used in place of both end plates 102b and 102c. End plate 202b includes an aperture 232. Then, the one-piece portion 102a is inserted. One piece portion 102a has two bends in order to cover the longer two sidewalls of inner wall 104 and the bottom surface 105 of arc chamber 100, as shown in FIG. 3. The bends are designed to match the surface of arc chamber 100 and are preferably 85°. One piece portion 102a holds the two end plates 102b in place. Tension in one-piece portion 102a holds it in place. One piece portion 102a also includes portion 150. An aperture 124 is included in liner 102a for feeding desired gases to the chamber and is designed to match means 114 in arc chamber 100. The liner 102 creates a seal that prevents outgassing. It prevents the interaction of the arc chamber inner wall 104 from the plasma.

An alternative liner portion 202a is shown in FIG. 7. Liner portion 202a could replace liner portion 102a. Liner portion 202a includes two additional apertures 228 and 230. Apertures 228 and 230 are for auxiliary gas inlets.

Liner 102 may be fabricated using, for example, tungsten. Molybdenum may also be used if the product is not sensitive to molybdenum. Other materials having the electrical characteristic to contain an ionic plasma field may alternatively be used. Liner 102 is a thin sheet of material. The thickness may be on the order of 0.06 inch.

The inner wall 104 of arc chamber 100 may also contain two divots 106. The divots 106 may be used to insert pliers to install and/or remove liner 102. The divots 106 are preferably centered in each of the opposing longer sidewalls of inner wall 104 as shown in FIG. 2A.

In operation, when the liner 102 wears out, it is removed and replaced. The liner 102 is much less expensive to fabricate. Thus, the cost of replacing the liner 102 is much less expensive than replacing the entire arc chamber. Current arc chambers can cost in excess of $3000–$6000, whereas a liner is expected to cost under $100. Thus, even with the one time cost of milling, significant reduction in expense can be obtained. Furthermore, old arc chambers that have been removed due to the erosion of the inner surface may now be reused by milling out the surface and inserting a liner 102.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A liner for an arc chamber of an ion implanter, comprising:
   a one piece portion with at least two bends for covering a bottom surface and two inner sidewalls of said arc chamber; and
   two end plates for covering two additional inner sidewalls of said arc chamber.

2. The liner of claim 1, wherein said one-piece portion and said two end plates comprise tungsten.

3. The liner of claim 1, wherein said one-piece portion and said two end plates comprise molybdenum.

4. The liner of claim 1, wherein said one piece portion and said two end plates each have a thickness on the order of 0.06 inch.

5. An ion implanter comprising:
   an arc chamber; and
   a removable liner within said arc chamber, said liner comprising:
      a one piece portion with at least two bends for covering a bottom surface and two inner sidewalls of said arc chamber; and
      two end plates for covering two additional inner sidewalls of said arc chamber.

6. The ion implanter of claim 5, wherein said one-piece portion and said two end plates comprise tungsten.

7. The ion implanter of claim 5, wherein said one-piece portion and said two end plates comprise molybdenum.

8. The ion implanter of claim 5, wherein said one piece portion and said two end plates each have a thickness on the order of 0.06 inch±0.04 inch.

9. The ion implanter of claim 5, wherein said arc chamber comprises a divot in each of said two inner walls for inserting and removing said liner.

10. The ion implanter of claim 5, wherein said inner walls of said arc chamber have been milled out a thickness approximately equal to a thickness of said liner.

11. The ion implanter of claim 5, wherein said one-piece portion is located within said arc chamber such that it is held in place by tension.

12. The ion implanter of claim 11, wherein said one-piece portion is located such that it secures the two end plates in place to create a seal within said arc chamber.

13. The ion implanter of claim 5, wherein said arc chamber comprises graphite.

* * * * *